United States Patent
Shin et al.

(10) Patent No.: US 10,825,938 B2
(45) Date of Patent: Nov. 3, 2020

(54) SOLAR CELL MODULE

(71) Applicant: LG ELECTRONICS INC., Seoul (KR)

(72) Inventors: Taehee Shin, Seoul (KR); Daehee Jang, Seoul (KR); Chunghyun Lim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 73 days.

(21) Appl. No.: 14/750,826

(22) Filed: Jun. 25, 2015

(65) Prior Publication Data

US 2015/0380571 A1 Dec. 31, 2015

(30) Foreign Application Priority Data

Jun. 26, 2014 (KR) .................. 10-2014-0079261

(51) Int. Cl.
*H01L 31/0224* (2006.01)
*H01L 31/05* (2014.01)
*H01L 31/068* (2012.01)

(52) U.S. Cl.
CPC .. *H01L 31/022441* (2013.01); *H01L 31/0504* (2013.01); *H01L 31/0516* (2013.01); *H01L 31/0682* (2013.01); *Y02E 10/547* (2013.01)

(58) Field of Classification Search
CPC ....... H01L 31/02245; H01L 31/022458; H01L 31/0512; H01L 31/0516
See application file for complete search history.

(56) References Cited

U.S. PATENT DOCUMENTS

| | | | | |
|---|---|---|---|---|
| 2003/0000571 A1* | 1/2003 | Wakuda | ............... | H01L 31/048 136/256 |
| 2005/0115602 A1* | 6/2005 | Senta | ............... | H01L 31/035281 136/250 |
| 2008/0169020 A1* | 7/2008 | Shiomi | ........... | H01L 31/022425 136/252 |
| 2009/0288697 A1* | 11/2009 | Shimizu | ................ | H05K 3/323 136/244 |
| 2011/0017261 A1* | 1/2011 | Saita | ............... | H01L 31/022433 136/244 |
| 2011/0120530 A1* | 5/2011 | Isaka | ................ | B32B 17/10018 136/251 |

(Continued)

FOREIGN PATENT DOCUMENTS

JP         2011003724 A   *   1/2011

*Primary Examiner* — Eric R Smith
(74) *Attorney, Agent, or Firm* — Birch, Stewart, Kolasch & Birch, LLP

(57) ABSTRACT

A solar cell module is disclosed. The solar cell module includes a plurality of solar cells each including a semiconductor substrate, in which a p-n junction is formed, and a plurality of first and second electrodes which are formed on a back surface of the semiconductor substrate and are separated from each other, a plurality of interconnectors which are connected to the first electrodes or the second electrodes included in each solar cell and connect the plurality of solar cells in series, and a conductive adhesive attaching the interconnectors to the first electrodes or the second electrodes. The conductive adhesive includes the same material or the same metal-based material as a metal material included in at least one of the interconnectors or the first and second electrodes.

11 Claims, 14 Drawing Sheets

(56) References Cited

U.S. PATENT DOCUMENTS

| | | | | |
|---|---|---|---|---|
| 2011/0277817 A1* | 11/2011 | Ide | ............... | H01L 31/022441 |
| | | | | 136/246 |
| 2011/0290298 A1* | 12/2011 | Krause | ............ | H01L 31/022433 |
| | | | | 136/244 |
| 2012/0204938 A1* | 8/2012 | Hacke | ............ | H01L 31/022441 |
| | | | | 136/246 |
| 2012/0291838 A1* | 11/2012 | Jang | ............... | H01L 31/022441 |
| | | | | 136/244 |
| 2012/0291846 A1* | 11/2012 | Mikami | ......... | H01L 31/022441 |
| | | | | 136/244 |
| 2012/0312358 A1* | 12/2012 | Yamashita | ........... | H01L 31/048 |
| | | | | 136/251 |
| 2013/0081675 A1* | 4/2013 | Joe | ............... | H01L 31/022441 |
| | | | | 136/251 |
| 2013/0174886 A1* | 7/2013 | Furukawa | ............. | C09J 7/0203 |
| | | | | 136/244 |
| 2013/0244371 A1* | 9/2013 | Sewell | ........... | H01L 31/022441 |
| | | | | 438/96 |
| 2013/0340813 A1* | 12/2013 | Momozaki | ............ | H01B 1/026 |
| | | | | 136/251 |

* cited by examiner

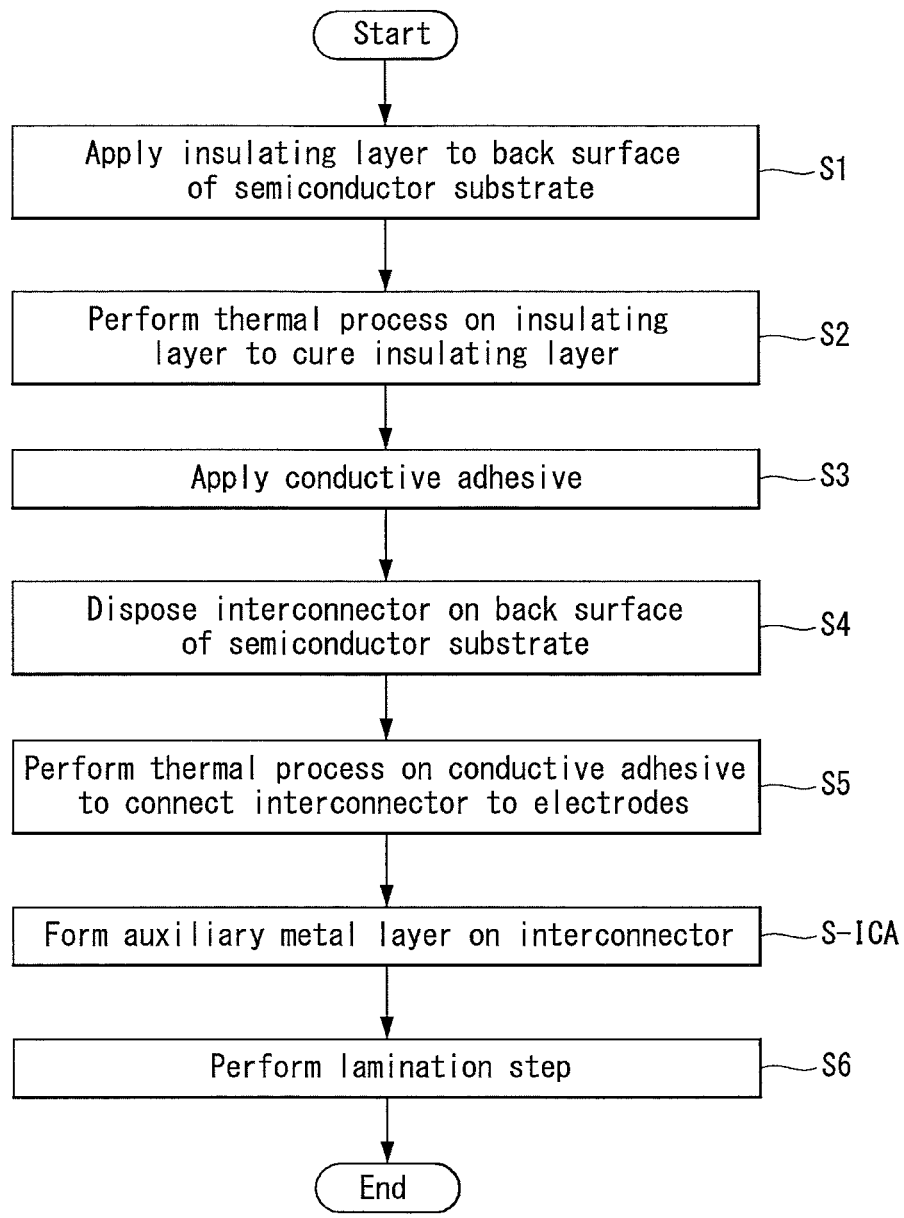

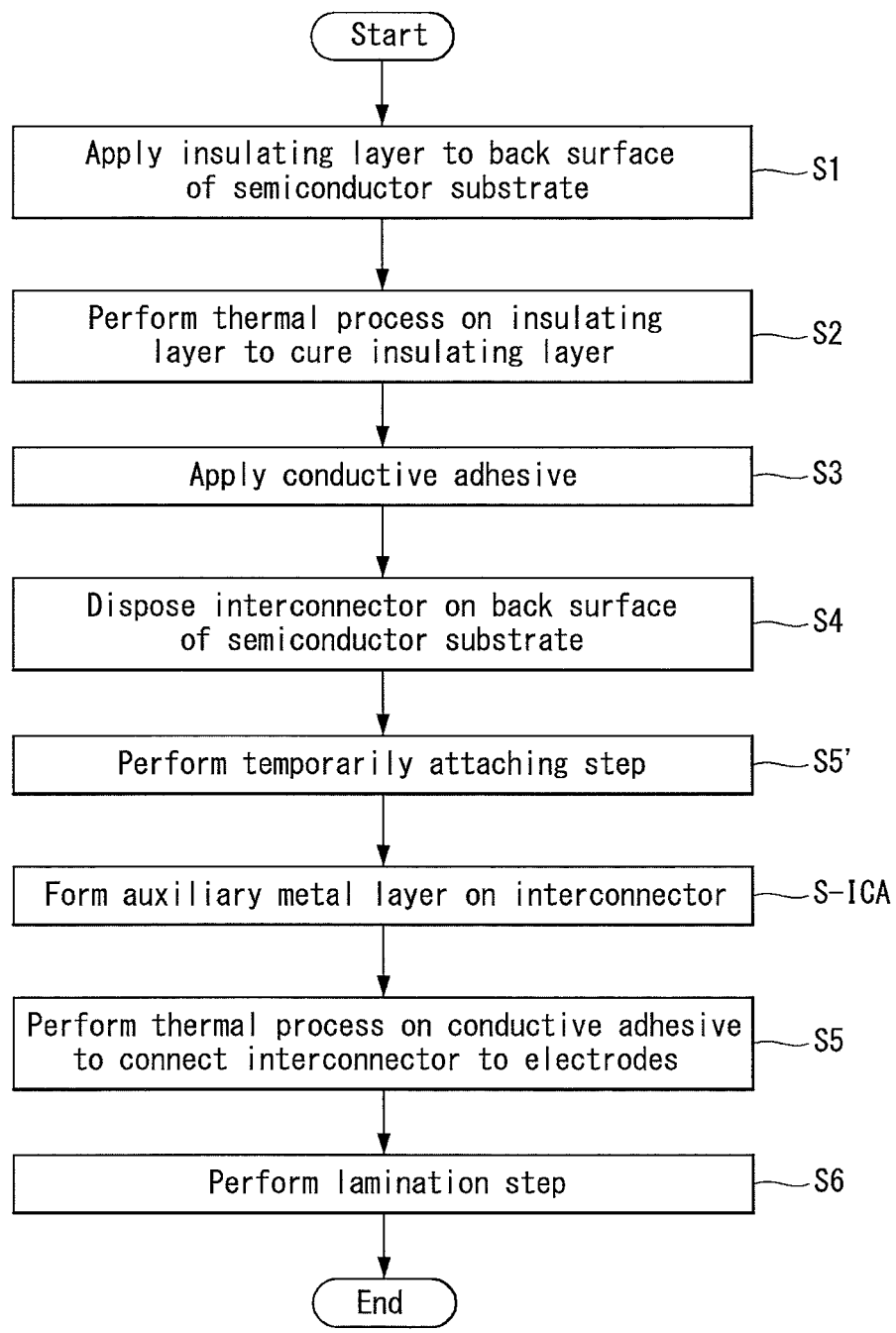

SOLAR CELL MODULE

CROSS-REFERENCE TO RELATED APPLICATION

This application claims priority to and the benefit of Korean Patent Application No. 10-2014-0079261 filed in the Korean Intellectual Property Office on Jun. 26, 2014, the entire contents of which are incorporated herein by reference.

BACKGROUND OF THE INVENTION

1. Field of the Invention

Embodiments of the invention relate to a solar cell module.

2. Description of the Related Art

A solar cell generally includes a substrate and an emitter region, which are formed of semiconductors of different conductive types, for example, a p-type and an n-type, and electrodes respectively connected to the substrate and the emitter region. A p-n junction is formed at an interface between the substrate and the emitter region.

The solar cell using the semiconductor substrate may be classified into a conventional solar cell and a back contact solar cell depending on a structure.

The conventional solar cell is configured such that an emitter region is positioned on a front surface of a substrate, an electrode connected to the emitter region is positioned on the front surface of the substrate, and an electrode connected to the substrate is positioned on a back surface of the substrate. The back contact solar cell is configured such that an emitter region is positioned on a back surface of a substrate, and all of electrodes are positioned on the back surface of the substrate.

Because all of the electrodes of the back contact solar cell are formed on the back surface of the substrate, the electrodes formed on the back surface of the substrate are connected in series to electrodes of an adjacent solar cell through an interconnector or a separate conductive metal. Hence, a solar cell module may be manufactured.

SUMMARY OF THE INVENTION

In one aspect, there is a solar cell module including a plurality of solar cells each including a semiconductor substrate, in which a p-n junction is formed, and a plurality of first and second electrodes which are formed on a back surface of the semiconductor substrate and are separated from each other, a plurality of interconnectors configured to be connected to the first electrodes or the second electrodes included in each solar cell and connect the plurality of solar cells in series, and a conductive adhesive configured to attach the interconnectors to the first electrodes or the second electrodes, wherein the conductive adhesive includes the same material or the same metal-based material as a metal material included in at least one of the interconnectors or the first and second electrodes.

Each interconnector may include a core formed of a conductive metal material and a coating layer coated on the surface of the core with a first metal material. The conductive adhesive may include the first metal material or a metal alloy material including the first metal material. The coating layer may be a solder layer.

The conductive adhesive may include a solder paste including the first metal material or a metal alloy material including the first metal material, or a resin layer formed of an insulating material and metal particles including the first metal material or a metal alloy material including the first metal material in the resin layer.

The first metal material may include at least one of tin (Sn), gold (Au), silver (Ag), copper (Cu), or nickel (Ni).

The plurality of first and second electrodes may include the first metal material or a metal alloy material including the first metal material.

Each of the plurality of first and second electrodes may extend in a first direction. The plurality of solar cells may be arranged in a second direction crossing the first direction. Each of the plurality of interconnectors may extend in the second direction.

The plurality of solar cells may include first, second, and third solar cells sequentially arranged in the second direction. The plurality of interconnectors may include a first interconnector and a second interconnector. The first interconnector may be connected to a plurality of second electrodes of the first solar cell and a plurality of first electrodes of the second solar cell through the conductive adhesive. The second interconnector may be connected to a plurality of second electrodes of the second solar cell and a plurality of first electrodes of the third solar cell through the conductive adhesive.

For example, in the second solar cell, a formation position of the conductive adhesive may include a first connection position, where the first interconnector and the plurality of first electrodes of the second solar cell cross each other and are connected to each other, and a second connection position where the second interconnector and the plurality of second electrodes of the second solar cell cross each other and are connected to each other. Further, in the second solar cell, the conductive adhesive may be formed in a portion of the first connection position or a portion of the second connection position.

In the second solar cell, an insulating layer may be positioned between the first interconnector and the plurality of second electrodes of the second solar cell and between the second interconnector and the plurality of first electrodes of the second solar cell.

In the second solar cell, the insulating layer may have a plurality of openings for partially exposing the first electrodes or the second electrodes connected to the interconnector.

Further, the insulating layer may have a barrier shape, so as to expose a portion of the first electrode or the second electrode connected to the interconnector.

In the semiconductor substrate of each solar cell, a thickness of a first portion of the semiconductor substrate, on which the plurality of first electrodes are positioned, may be greater than a thickness of a second portion of the semiconductor substrate, on which the plurality of second electrodes are positioned. A thickness of each first electrode may be less than a thickness of each second electrode.

A sum of the thickness of the first portion of the semiconductor substrate and the thickness of the first electrode may be the same as a sum of the thickness of the second portion of the semiconductor substrate and the thickness of the second electrode within a margin of error. In this instance, the margin of error may be 10%.

The interconnector may further include an auxiliary metal layer on the surface of the coating layer.

The auxiliary metal layer may be positioned on the surface of the interconnector as well as the surface of the coating layer and covers a portion of the conductive adhesive or the insulating layer.

A cross section of the interconnector may have a wire shape, in which a width and a thickness are the same as each other, a rectangular shape in which a width is greater than a thickness, a trapezoidal shape, or a polygonal shape.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 13 to 17 relate to various examples of a method for manufacturing a solar cell module according to an example embodiment of the invention.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will noted that a detailed description of known arts will be omitted if the detailed description of the known arts can obscure the embodiments of the invention.

In the following description, "front surface" may be one surface of a semiconductor substrate, on which light is directly incident, and "back surface" may be a surface opposite the one surface of the semiconductor substrate, on which light is not directly incident or reflective light may be incident.

Example embodiments of the invention will be described with reference to FIGS. 1 to 17.

Figure 1:
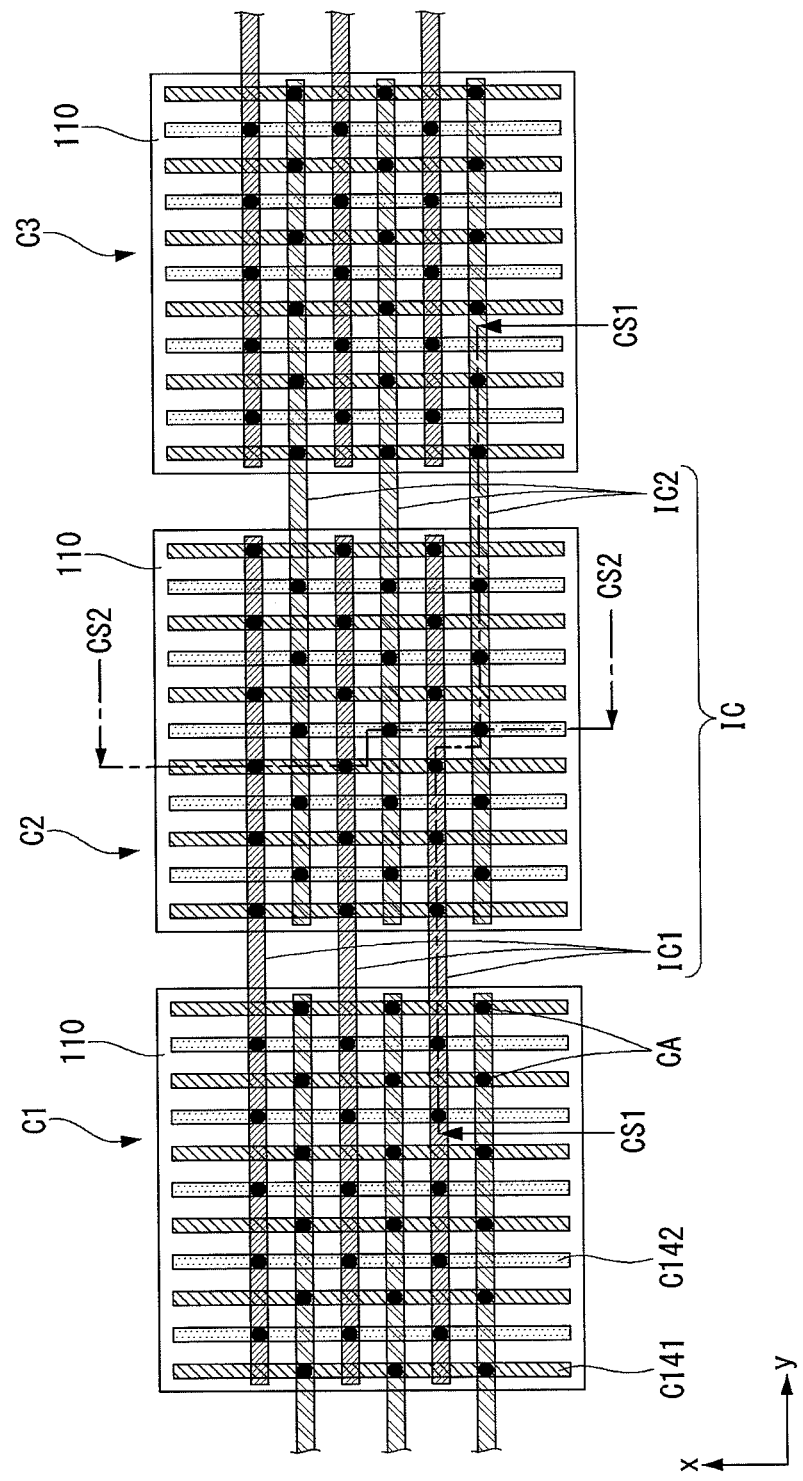
FIG. 1 is a plane view showing an example of a solar cell module according to an example embodiment of the invention.
Figure 2:
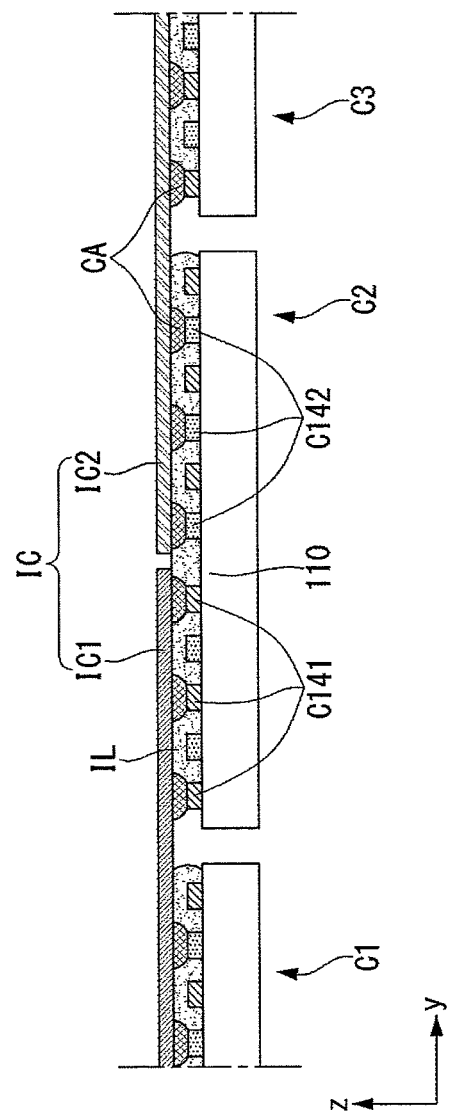
FIG. 2 is a cross-sectional view taken along line CS1-CS1 of FIG. 1.
Figure 3:
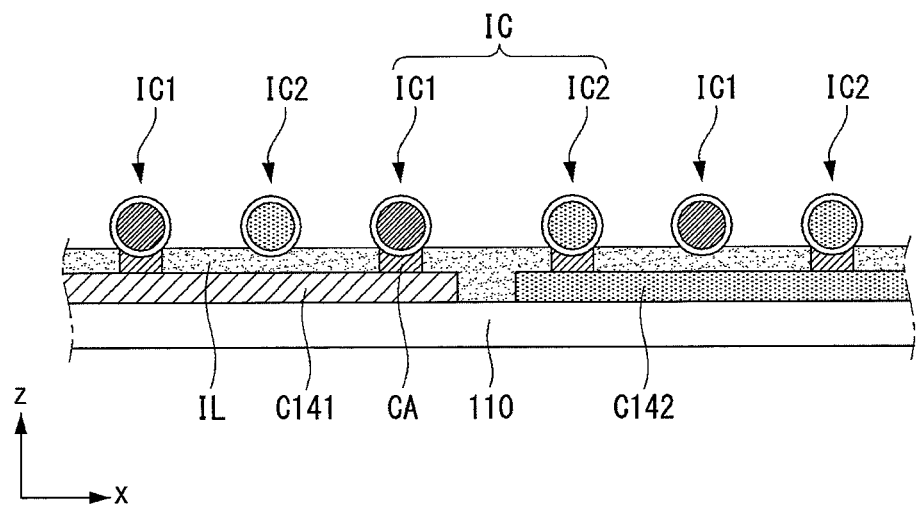
FIG. 3 is a cross-sectional view taken along line CS2-CS2 of FIG. 1.
Figure 4:
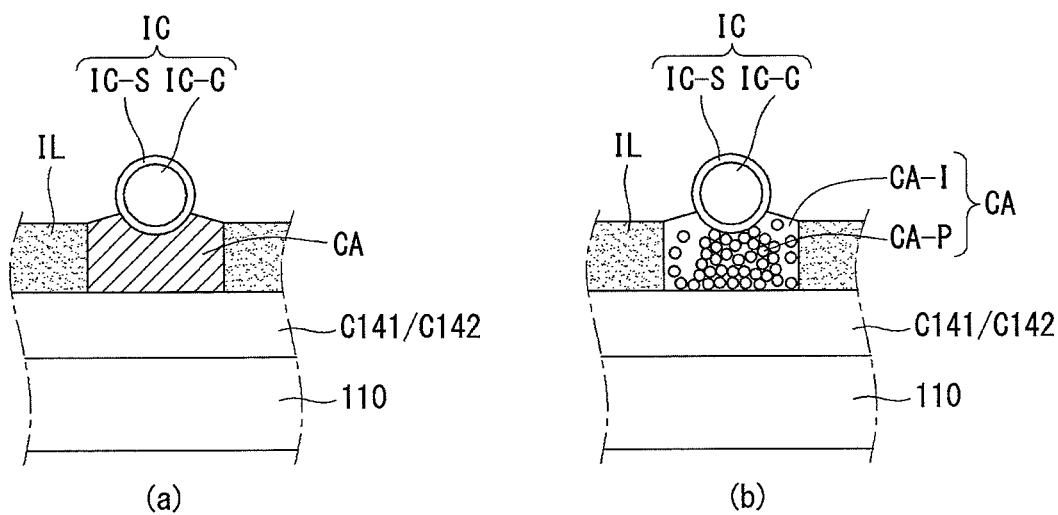
FIG. 4 illustrates a conductive adhesive for connecting electrodes included in each solar cell of the solar cell module shown in FIG. 1 to an interconnector.

FIG. 1 is a plane view showing an example of a solar cell module according to an example embodiment of the invention. FIG. 2 is a cross-sectional view taken along line CS1-CS1 of FIG. 1. FIG. 3 is a cross-sectional view taken along line CS2-CS2 of FIG. 1. FIG. 4 illustrates a conductive adhesive for connecting electrodes included in each solar cell of the solar cell module shown in FIG. 1 to an interconnector.

As shown in FIG. 1, the solar cell module according to the embodiment of the invention includes a plurality of solar cells C1 to C3, a plurality of interconnectors IC, and a conductive adhesive CA.

For example, as shown in FIG. 1, the plurality of solar cells C1 to C3 may include first, second, and third solar cells C1, C2, and C3. Each of the plurality of solar cells C1 to C3 may include a semiconductor substrate 110, at which a p-n junction is formed, and a plurality of first and second electrodes C141 and C142 which are formed on a back surface of the semiconductor substrate 110 and are separated from each other.

For example, in each of the plurality of solar cells C1 to C3, the plurality of first and second electrodes C141 and C142 formed on the back surface of the semiconductor substrate 110 may extend in a first direction x. The plurality of solar cells C1 to C3 may be sequentially arranged in a second direction y crossing the first direction x Each of the plurality of interconnectors IC may be connected to one of the first and second electrodes C141 and C142 included in each of the plurality of solar cells C1 to C3, thereby connecting the plurality of solar cells C1 to C3 in series.

The interconnector IC may be attached to one of the first and second electrodes C141 and C142 using a conductive adhesive CA and may be electrically connected to the electrodes C141 or C142.

As shown in FIG. 1, the plurality of interconnectors IC may extend in the second direction y crossing the plurality of first and second electrodes C141 and C142.

As described above, when the plurality of interconnectors IC are arranged in the second direction y crossing the plurality of first and second electrodes C141 and C142, the alignment of the interconnectors IC may be more easily performed. When the interconnector IC is connected to the electrodes C141 or C142, a contraction direction of the interconnector IC and a contraction direction of the electrode C141 or C142 may cross each other due to a thermal expansion coefficient. Hence, the bending of the semiconductor substrate 110 included in each solar cell may be minimized.

The plurality of interconnectors IC may include first interconnectors IC1 and second interconnectors IC2.

The first interconnectors IC1 may connect the first solar cell C1 to the second solar cell C2 in series, and the second interconnectors IC2 may connect the second solar cell C2 to the third solar cell C3 in series.

More specifically, as shown in FIG. 2, the first interconnector IC1 may be connected to the plurality of second electrodes C142 of the first solar cell C1 and the plurality of first electrodes C141 of the second solar cell C2 through the conductive adhesive CA.

Further, the second interconnector IC2 may be connected to the plurality of second electrodes C142 of the second solar cell C2 and the plurality of first electrodes C141 of the third solar cell C3 through the conductive adhesive CA.

Namely, a formation position of the conductive adhesive CA using the second solar cell C2 as an example may include a first connection position, where the first interconnector IC1 and the plurality of first electrodes C141 of the second solar cell C2 cross each other and are connected to each other, and a second connection position where the second interconnector IC2 and the plurality of second electrodes C142 of the second solar cell C2 cross each other and are connected to each other. In the second solar cell C2, the conductive adhesive CA may be formed in a portion of the first connection position or a portion of the second connection position.

In the embodiment disclosed herein, the conductive adhesive CA may use a solder paste, a conductive paste, in which conductive metal particles are included in an insulating resin, or a conductive adhesive film.

In each of the first, second, and third solar cells C1, C2, and C3, an insulating layer IL may be positioned between the plurality of first electrodes C141 or the plurality of second electrodes C142, which are not connected to the interconnectors IC, and the interconnectors IC.

More specifically, as shown in FIGS. 2 and 3, the insulating layer IL using the second solar cell C2 as an example may be positioned between the first interconnector IC1 and the plurality of second electrodes C142 and between the second interconnector IC2 and the plurality of first electrodes C141.

Hence, the insulating layer IL may more efficiently prevent the unnecessary short circuit or the unnecessary shunt between each solar cell and the interconnectors IC. The insulating layer IL may include an insulating resin, such as epoxy.

In the solar cell module according to the embodiment of the invention, the conductive adhesive CA may include the same material or the same metal-based material as a metal material included in the interconnector IC.

As described above, when the conductive adhesive CA includes the same material or the same metal-based material as a metal material included in at least one of the interconnector IC or the electrodes C141 and C142, an adhesive strength and a contact resistance between the conductive adhesive CA and the interconnector IC or the electrodes C141 and C142 may be improved.

More specifically, when the conductive adhesive CA and the interconnector IC each include a different metal material, it is difficult to form an alloy between the conductive adhesive CA and the interconnector IC when the conductive adhesive CA and the interconnector IC are attached to each other through a thermal process. Hence, a crack resulting in excessive degradation in the adhesive strength and the contact resistance between the conductive adhesive CA and the interconnector IC may be generated.

When the crack is generated as described above, a short circuit current Isc may be greatly reduced, and thus a fill factor and the reliability may be reduced.

However, as in the embodiment of the invention, when the conductive adhesive CA and the interconnector IC include the same metal material or the same metal-based material, the crack may be prevented from being generated.

When the interconnector IC is formed of one metal, for example, copper (Cu), the conductive adhesive CA may include copper (Cu) or the same metal-based material as copper (Cu).

In the embodiment disclosed herein, the same metal-based material may be a metal alloy including the same metal, or a metal material or a metal alloy having the same thermal expansion coefficient within a margin of error of about 10%.

On the contrary, as shown in (a) and (b) of FIG. 4, the interconnector IC according to the embodiment of the invention may include a core IC-C formed of a conductive metal material and a coating layer IC-S coated on the surface of the core IC-C with a first metal material.

The first metal material may include at least one of tin (Sn), gold (Au), silver (Ag), copper (Cu), or nickel (Ni).

When the first metal material of the coating layer IC-S includes, for example, tin (Sn), the coating layer IC-S may be formed as a solder layer including Sn-based material. More specifically, the coating layer IC-S may be formed of one of SnBiAg, SnBi, SnAg, SnPbAg, and SnIn.

The conductive adhesive CA may be formed of the first metal material or a metal alloy material including the first metal material. Namely, the first metal material of the conductive adhesive CA may be tin (Sn), and the metal alloy material including the first metal material may be a metal alloy material including tin (Sn).

As shown in (a) of FIG. 4, when the conductive adhesive CA is formed of a solder paste, the solder paste may be formed of the first metal material, for example, tin (Sn) or a metal alloy material including the first metal material, for example, SnBiAg, SnBi, SnAg, SnPbAg, or SnIn.

On the contrary, as shown in (b) of FIG. 4, when the conductive adhesive CA is formed of a conductive paste, in which conductive metal particles CA-P are included in an insulating resin CA-I, the conductive metal particles CA-P of the conductive adhesive CA may be formed of the first metal material, for example, tin (Sn) or a metal alloy material including the first metal material, for example, SnBiAg, SnBi, SnAg, SnPbAg, or SnIn.

FIG. 4 shows that the coating layer IC-S of the interconnector IC includes tin (Sn), as an example. However, the coating layer IC-S of the interconnector IC may include at least one of gold (Au), silver (Ag), copper (Cu), or nickel (Ni) included in the first metal material. Even in this instance, the conductive adhesive CA may be formed of the first metal material or the metal alloy material including the first metal material.

Further, (a) and (b) of FIG. 4 show that a cross section of the interconnector IC has a circular shape, as an example. However, the cross section of the interconnector IC may have a wire shape, in which a width and a thickness are the same as each other, a rectangular shape, in which a width is greater than a thickness, a trapezoidal shape, or a polygonal shape.

Figure 5:
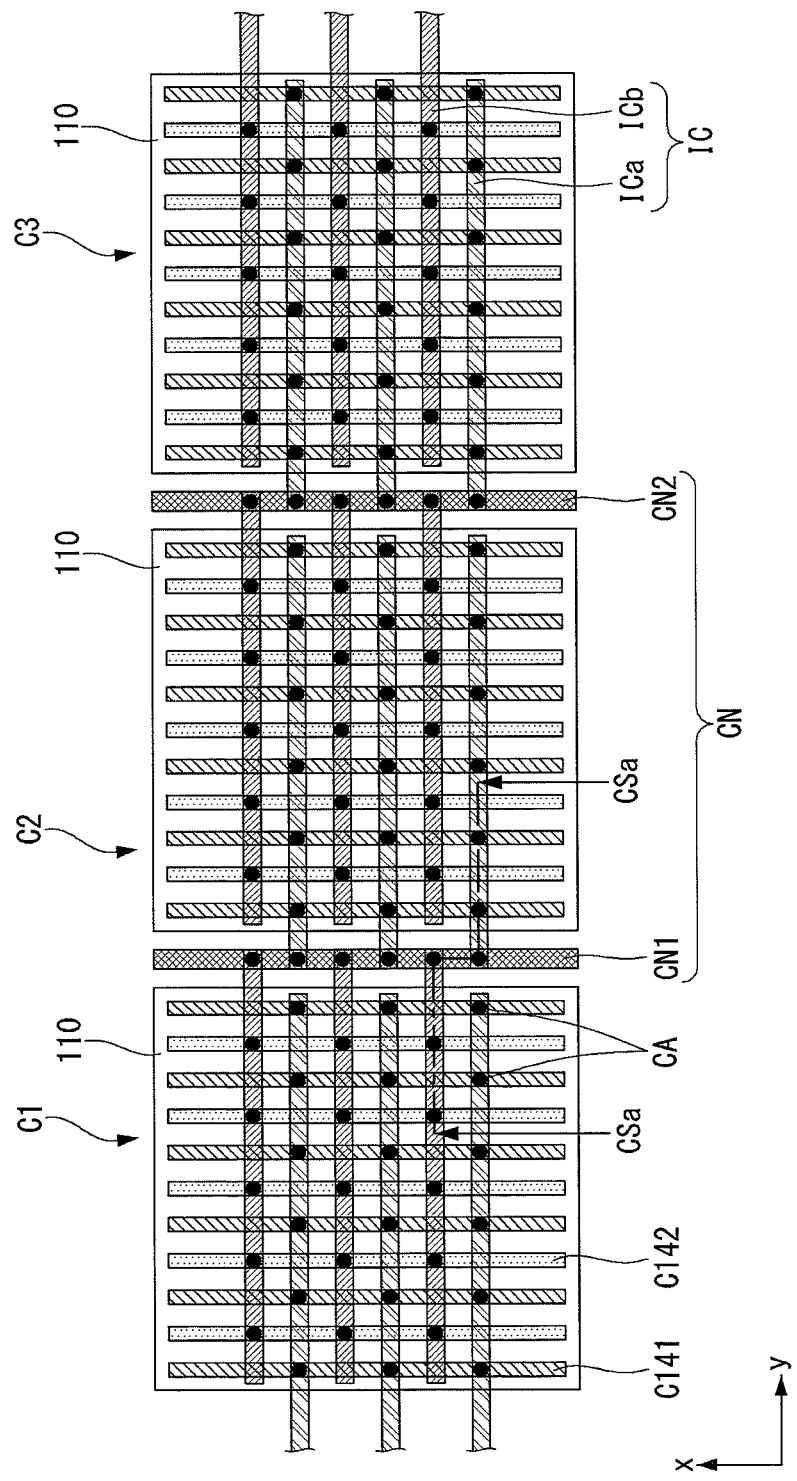
FIG. 5 is a plane view showing another example of a solar cell module according to an example embodiment of the invention.
Figure 6:
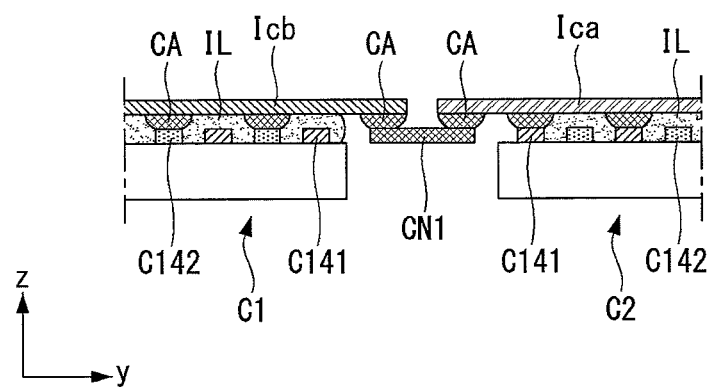
FIG. 6 is a cross-sectional view taken along line CSa-CSa of FIG. 5.

FIGS. 5 and 6 show another example of a solar cell module according to the embodiment of the invention. More specifically, FIG. 5 is a plane view showing another example of a solar cell module according to the embodiment of the invention, and FIG. 6 is a cross-sectional view taken along line CSa-CSa of FIG. 5.

The solar cell module shown in FIGS. 5 and 6 is substantially the same as the solar cell module shown in FIGS. 1 to 4, except that interconnectors are connected through connectors and connect the adjacent solar cells.

As shown in FIGS. 5 and 6, an interconnector IC includes first interconnectors ICa and second interconnectors ICb. The first interconnectors ICa and the second interconnectors ICb are alternately disposed in the first direction x and are arranged in parallel with each other.

The first interconnector ICa is connected to one (e.g., C141 or C142) of the first and second electrodes C141 and C142 included in each of the plurality of solar cells C1 to C3, and the second interconnector ICb is connected to the other electrode (e.g., C142 or C141) to which the first interconnector ICa is not connected.

The interconnector IC is attached to one of the first and second electrodes C141 and C142 using a conductive adhesive CA and is electrically connected to the electrodes C141 or C142.

In each of the first, second, and third solar cells C1, C2, and C3, an insulating layer IL may be positioned between the plurality of first electrodes C141 or the plurality of second electrodes C142, which are not connected to the first interconnector ICa or the second interconnector ICb. Hence, the plurality of first electrodes C141 or the plurality of second electrodes C142 and the first interconnector ICa or the second interconnector ICb are not connected. In FIGS. 5 and 6, a portion indicated by a point indicates a connection portion between the first electrode C141 or the second electrode C142 and the first interconnector ICa or the second interconnector ICb using the conductive adhesive CA.

The first and second interconnectors ICa and ICb connected to each of the first to third solar cells C1 to C3 are connected through a connector CN positioned between the two adjacent solar cells.

The connector CN is positioned between the two adjacent solar cells and extends in a direction crossing the interconnector IC. The connector CN may be formed of the same material as the interconnector IC, or may be formed of a metal material having the conductivity.

As shown in FIGS. 5 and 6, a first connector CN1 is positioned between the first solar cell C1 and the second solar cell C2, and a second connector CN2 is positioned between the second solar cell C2 and the third solar cell C3.

In the embodiment of the invention, the first connector CN1 connects the second interconnectors ICb connected to the second electrodes C142 of the first solar cell C1 to the first interconnectors ICa connected to the first electrodes C141 of the second solar cell C2.

Further, the second connector CN2 connects the second interconnectors ICb connected to the second electrodes C142 of the second solar cell C2 to the first interconnectors ICa connected to the first electrodes C141 of the third solar cell C3.

One end of each of the second interconnectors ICb connected to the second electrodes C142 of the first solar cell C1 is positioned across the first connector CN1, and one end of each of the first interconnectors ICa connected to the first electrodes C141 of the second solar cell C2 is positioned across the first connector CN1.

The conductive adhesive CA is positioned at a crossing between the second interconnector ICb and the first connector CN1 and a crossing between the first interconnector ICa and the second connector CN2, and thus electrically connects the second interconnector ICb to the first connector CN1 and electrically connects the first interconnector ICa to the second connector CN2.

Hence, the first solar cell C1 and the second solar cell C2 are connected in series to each other through the first connector CN1, and also the second solar cell C2 and the third solar cell C3 are connected in series to each other through the second connector CN2.

The embodiment of the invention described that the first interconnector ICa and the second interconnector ICb are connected to the first connector CN1 using the conductive adhesive CA, as an example. However, the embodiment of the invention is not limited thereto. For example, the first interconnector ICa and the second interconnector ICb may be directly connected to the first connector CN1 through the soldering without using the conductive adhesive CA.

Hereinafter, an example of a solar cell applicable to the solar cell module according to the embodiment of the invention is described.

Figure 7:
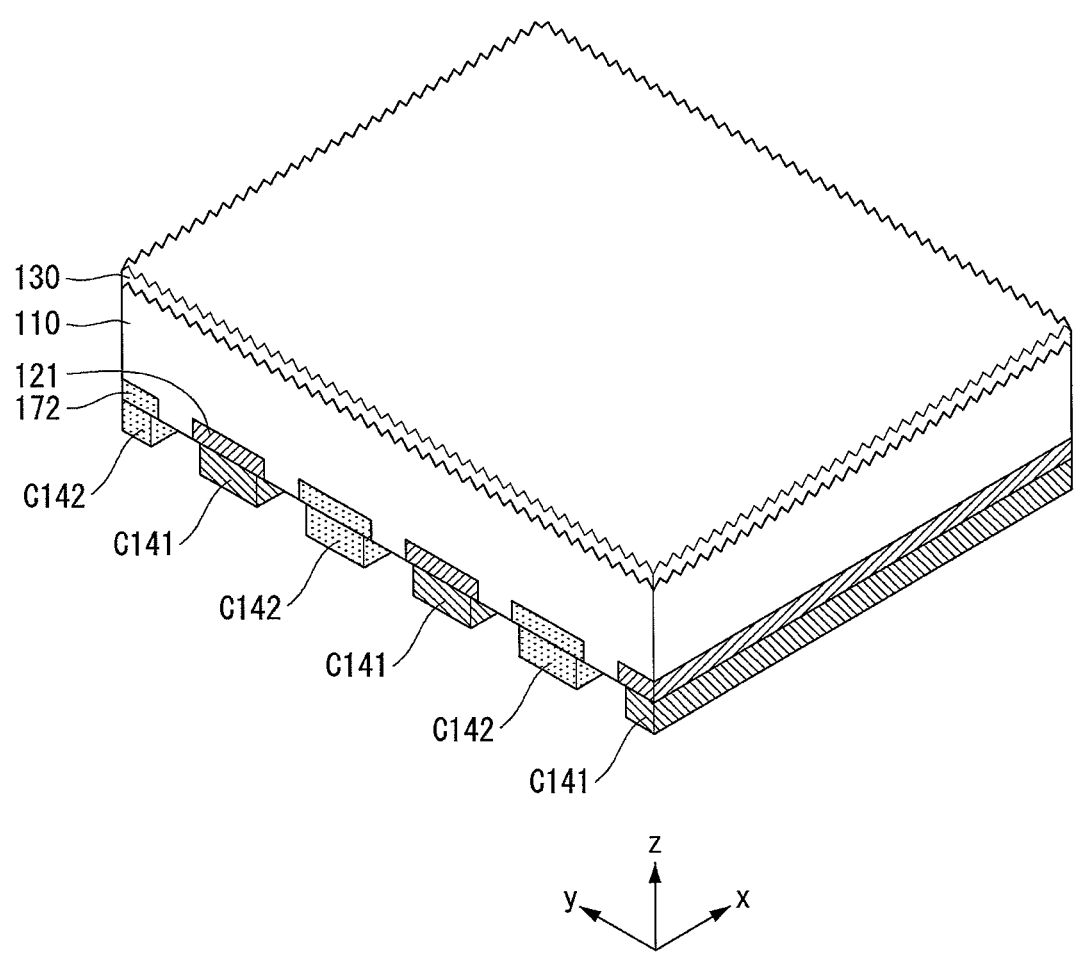
FIGS. 7 and 8 show an example of a solar cell of a solar cell module according to an example embodiment of the invention.
Figure 8:
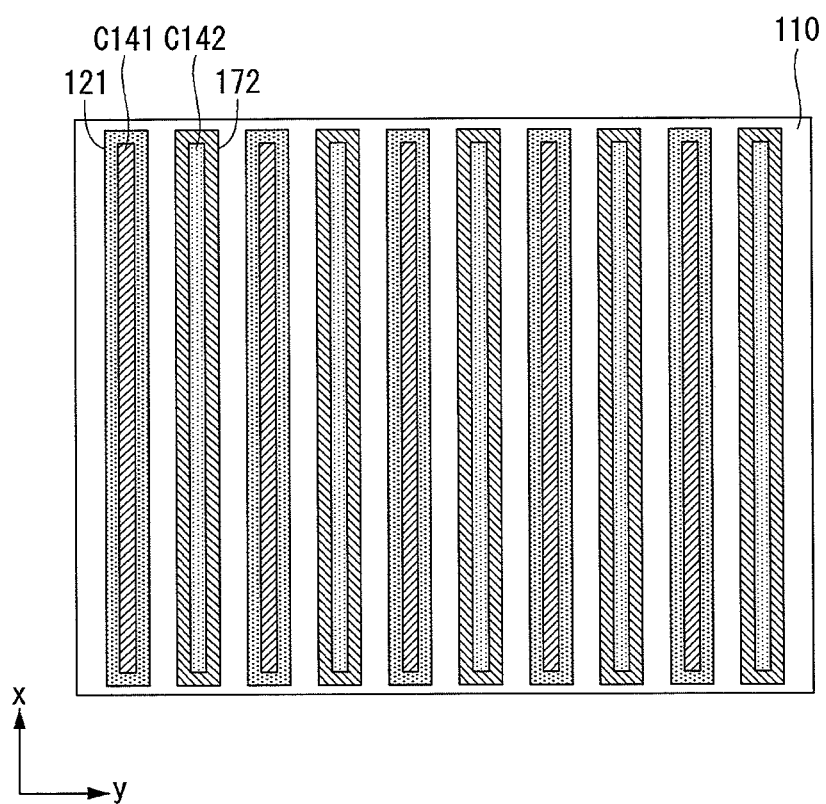

FIGS. 7 and 8 show an example of a solar cell of the solar cell module according to the embodiment of the invention. More specifically, FIG. 7 is a perspective view of the solar cell, and FIG. 8 shows an example of a back pattern of the solar cell.

As shown in FIG. 7, an example of the solar cell according to the embodiment of the invention may include a semiconductor substrate 110, an anti-reflection layer 130, an emitter region 121, a plurality of back surface field regions 172, a plurality of first electrodes C141, and a plurality of second electrodes C142.

The anti-reflection layer 130 and the back surface field regions 172 may be omitted in the embodiment of the invention, if necessary or desired. In the following description, the embodiment of the invention is described using the solar cell including the anti-reflection layer 130 and the back surface field regions 172 as an example.

The semiconductor substrate 110 may be a semiconductor substrate formed of silicon of a first conductive type, for example, an n-type, though not required. The semiconductor substrate 110 may be formed by doping a semiconductor wafer formed of crystalline silicon material with impurities of the first conductive type.

The emitter region 121 may be separated from one another inside a back surface opposite a front surface of the semiconductor substrate 110 and may extend in parallel with one another in the first direction x. Namely, the emitter region 121 may be in plural. The plurality of emitter regions 121 may contain impurities of a second conductive type (for example, p-type) opposite the first conductive type (for example, n-type) of the semiconductor substrate 110.

Hence, a p-n junction may be formed by the semiconductor substrate 110 and the emitter region 121.

The plurality of back surface field regions 172 may be positioned inside the back surface of the semiconductor substrate 110 and may be separated from one another. The plurality of back surface field regions 172 may extend in the first direction x parallel to the plurality of emitter regions 121. Thus, as shown in FIGS. 7 and 8, the plurality of emitter regions 121 and the plurality of back surface field regions 172 may be alternately positioned at the back surface of the semiconductor substrate 110.

Each back surface field region 172 may be a region (for example, an $n^{++}$-type region) which is more heavily doped than the semiconductor substrate 110 with impurities of the same conductive type as the semiconductor substrate 110.

The plurality of first electrodes C141 may be physically and electrically connected to the plurality of emitter regions 121, respectively, and may be formed on the back surface of the semiconductor substrate 110 along the emitter regions 121.

The plurality of second electrodes C142 may be formed on the back surface of the semiconductor substrate 110 along the plurality of back surface field regions 172 and may be physically and electrically connected to the semiconductor substrate 110 through the plurality of back surface field regions 172.

As shown in FIG. 8, the plurality of first electrodes C141 may extend in the first direction x and may be separated from one another in the second direction y crossing the first direction x.

Further, as shown in FIG. 8, the plurality of second electrodes C142 may extend in the first direction x and may be separated from one another in the second direction y.

The plurality of first and second electrodes C141 and C142 may be separated from each other and may be electrically insulated from each other. Further, the plurality of first and second electrodes C141 and C142 may be alternately disposed.

In the embodiment of the invention, a ratio of a thickness TC to a width WC of each of the plurality of first and second electrodes C141 and C142 may be 1:200 to 1:1500. For example, the thickness TC of each of the plurality of first and second electrodes C141 and C142 may be 0.2 μm to 1 μm, and the width WC of each of the plurality of first and second electrodes C141 and C142 may be 200 μm to 300 μm.

As described above, when the ratio of the thickness TC to the width WC of each of the first and second electrodes C141 and C142 is 1:200 to 1:1500, the manufacturing cost of the solar cell may be minimized.

In this instance, a cross-sectional area of each of the first and second electrodes C141 and C142 may excessively decrease, and thus a resistance of each of the first and second electrodes C141 and C142 may be a problem. However, the resistance may be solved by properly setting the number and a width of each of first and second lines P1 and P2 respectively connected to the first and second electrodes C141 and C142. The plurality of first and second electrodes C141 and C142 may be manufactured through a sputtering method, for example.

In the solar cell having the above-described structure according to the embodiment of the invention, holes collected by the first electrodes C141 and electrons collected by the second electrodes C142 may be used as electric power of an external device through an external circuit device.

The solar cell applied to the solar cell module according to the embodiment of the invention is not limited to FIGS. 7 and 8. The components of the solar cell may vary, except that the first and second electrodes C141 and C142 included in the solar cell are formed on the back surface of the semiconductor substrate 110.

In the solar cell according to the embodiment of the invention, the plurality of first and second electrodes C141 and C142 may include the first metal material included in the above-described conductive adhesive CA or a metal alloy material including the first metal material.

Namely, the first and second electrodes C141 and C142 may include at least one of tin (Sn), gold (Au), silver (Ag), copper (Cu), or nickel (Ni) included in the first metal material of the conductive adhesive CA.

For example, when the first and second electrodes C141 and C142 include silver (Ag) or a metal alloy material including silver (Ag), the conductive adhesive CA for electrically connecting the first electrodes C141 or the second electrodes C142 to the interconnector IC may include silver (Ag) or the metal alloy material including silver (Ag).

As described above, when the first and second electrodes C141 and C142 and the conductive adhesive CA commonly include the first metal material or the metal alloy material including the first metal material, an adhesive strength and a contact resistance between the first and second electrodes C141 and C142 and the conductive adhesive CA may be further improved.

The above-described insulating layer IL may be formed on the back surface of the solar cell according to the embodiment of the invention. A pattern of the insulating layer IL is described in detail below.

Figure 9:
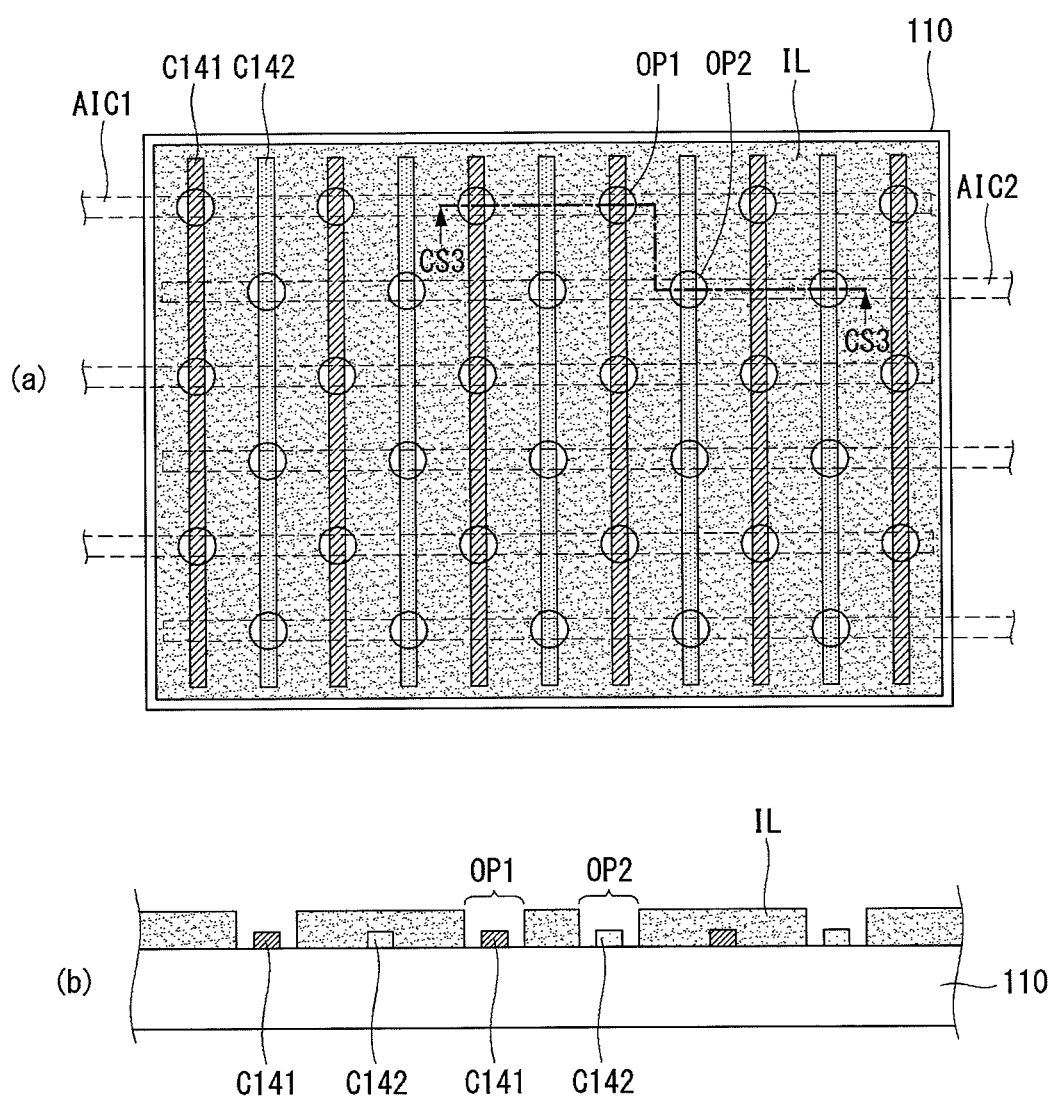
FIGS. 9 and 10 show various examples of an insulating layer in a solar cell module according to an example embodiment of the invention.
Figure 10:
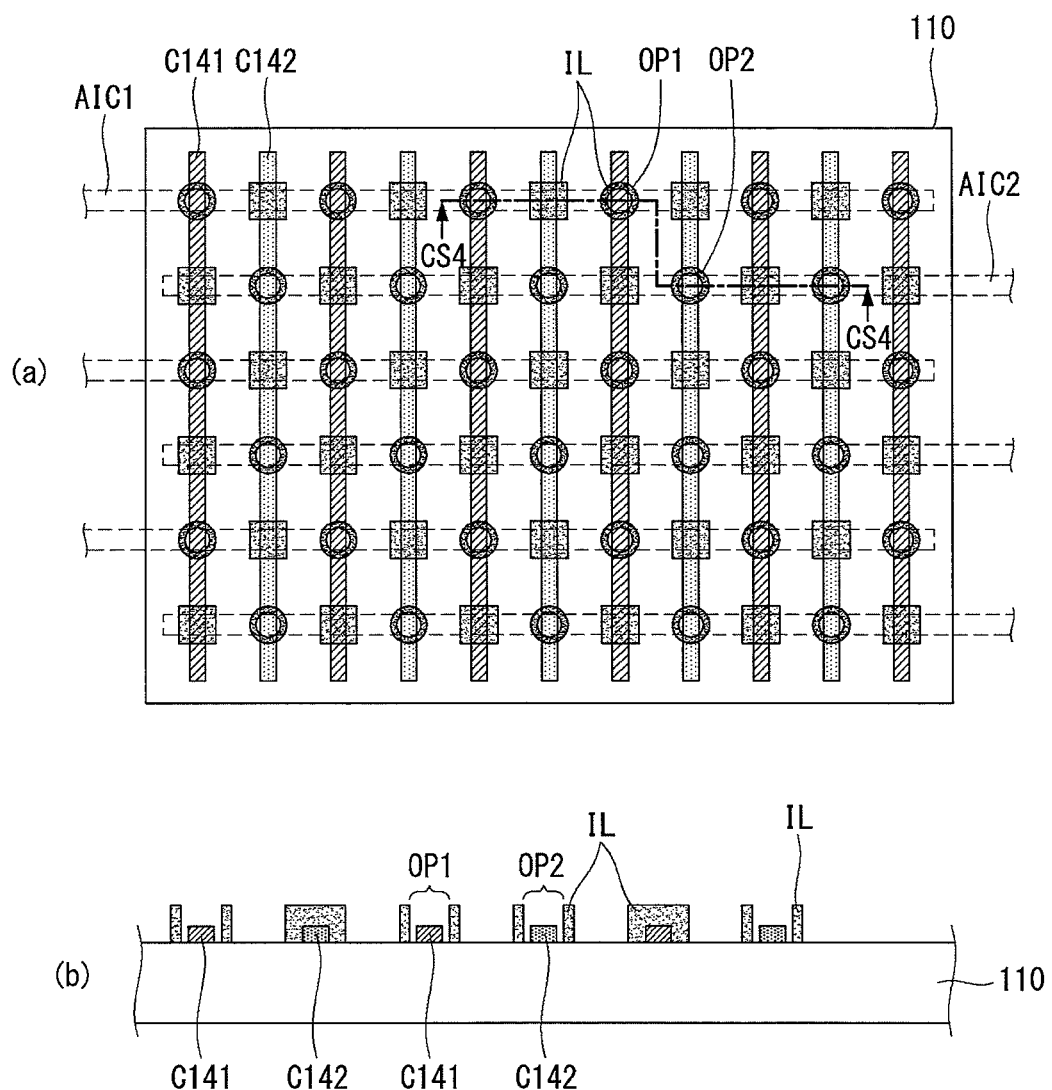

FIGS. 9 and 10 show various examples of the insulating layer in the solar cell module according to the embodiment of the invention.

(a) of FIG. 9 and (a) of FIG. 10 show an example where the insulating layer IL is formed on the back surface of the semiconductor substrate 110 of the solar cell having the structure shown in FIGS. 7 and 8.

Although the emitter region 121 and the back surface field region 172 formed at the back surface of the semiconductor substrate 110 are not shown in FIGS. 9 and 10, the description of structures and components identical or equivalent to those described above may be briefly made or may be entirely omitted in FIGS. 9 and 10 on the assumption that the emitter region 121 and the back surface field region 172 are formed at the back surface of the semiconductor substrate 110.

Further, (b) of FIG. 9 is a cross-sectional view taken along line CS3-CS3 in (a) of FIG. 9, and (b) of FIG. 10 is a cross-sectional view taken along line CS4-CS4 in (a) of FIG. 10.

In (a) of FIG. 9 and (a) of FIG. 10, an area AIC1 is an area overlapping the first interconnector IC1, and an area AIC2 is an area overlapping the second interconnector IC2.

As shown in (a) and (b) of FIG. 9, the insulating layer IL according to the embodiment of the invention may have a plurality of openings for partially exposing the first electrodes C141 or the second electrodes C142.

More specifically, for example, when the plurality of the first electrodes C141 are connected to the first interconnector IC1 and the plurality of the second electrodes C142 are connected to the second interconnector IC2, a first opening OP1 may be formed in an overlap area of the insulating layer IL between the plurality of first electrodes C141 and the first interconnector IC1, and a portion of the first electrode C141 may be exposed through the first opening OP1 of the insulating layer IL. Further, a second opening OP2 may be formed in an overlap area of the insulating layer IL between the plurality of second electrodes C142 and the second interconnector IC2, and a portion of the second electrode C142 may be exposed through the second opening OP2 of the insulating layer IL.

Thus, the insulating layer IL may be formed on almost the entire back surface of the semiconductor substrate 110 except a formation portion of the first and second openings OP1 and OP2.

The electrodes C141 or C142 exposed through the first opening OP1 or the second opening OP2 of the insulating layer IL may be connected to the interconnector IC through the conductive adhesive CA. Further, the electrodes C141 or C142, which have to be insulated from the interconnector IC, may be covered with the insulating layer IL, and thus the insulation between the electrodes C141 or C142 and the interconnector IC may be surely secured.

When the conductive adhesive CA is applied on the electrodes C141 or C142 so as to connect the electrodes C141 or C142 to the interconnector IC, the first opening OP1 or the second opening OP2 of the insulating layer IL may prevent the conductive adhesive CA from being widely spread.

Thus, the first opening OP1 or the second opening OP2 of the insulating layer IL may more easily prevent the undesired short circuit (resulting from the excessive spread of the conductive adhesive CA) between the first interconnector IC1 and the second interconnector IC2 or between the first electrode C141 and the second electrode C142.

FIG. 9 shows that the insulating layer IL is formed on almost the entire back surface of the semiconductor substrate 110 except a formation portion of the first and second openings OP1 and OP2, as an example.

On the contrary, the insulating layer IL according to the embodiment of the invention may have a barrier shape, so as to expose a portion of the electrode C141 or C142 connected to the interconnector IC.

More specifically, as shown in FIG. 10, the insulating layer IL may be formed on a portion of the electrode C141 or C142, which is not connected to the interconnector IC, in an overlap area between the first and second electrodes C141 and C142 and the interconnector IC, so as to insulate the electrodes C141 or C142 from the interconnector IC. Further, the insulating layer IL may have a barrier shape, so as to expose a portion of the electrode C141 or C142 connected to the interconnector IC.

The insulating layer IL of the barrier shape may have a round opening. More specifically, as shown in (a) and (b) of FIG. 10, the insulating layer IL may be formed in the barrier shape having a first opening OP1 or a second opening OP2.

Because the insulating layer IL is not formed on the entire back surface of the semiconductor substrate 110 and is formed only on a necessary potion of the back surface of the semiconductor substrate 110 as shown in FIG. 10, an amount of insulating layer IL used may further decrease. Hence, the manufacturing cost of the solar cell module may be reduced.

The pattern of the insulating layer IL shown in FIG. 9 or FIG. 10 may be formed through a printing method, an application method using an inkjet, a sputtering method, or a chemical vapor deposition (CVD) method.

It may be preferable, but not required, that a melting temperature of a material used in the insulating layer IL is equal to or higher than about 400° C., and its curing temperature is about 210° C. to 250° C.

Thus, the manufacturing process of the solar cell module may be more easily performed by connecting the electrodes C141 or C142 to the interconnector IC through the conductive adhesive CA in a state where the insulating layer IL is applied to the back surface of the semiconductor substrate 110 and then is previously cured.

So far, the solar cell applied to the solar cell module according to the embodiment of the invention was described on the assumption that a thickness of the semiconductor substrate 110 is uniform and thicknesses of the first and second electrodes C141 and C142 are the same as each other. However, the embodiment of the invention described with reference to FIGS. 1 to 10 may be equally applied to a solar cell, in which a thickness of the semiconductor substrate 110 is not uniform and thicknesses of the first and second electrodes C141 and C142 are different from each other.

Figure 11:
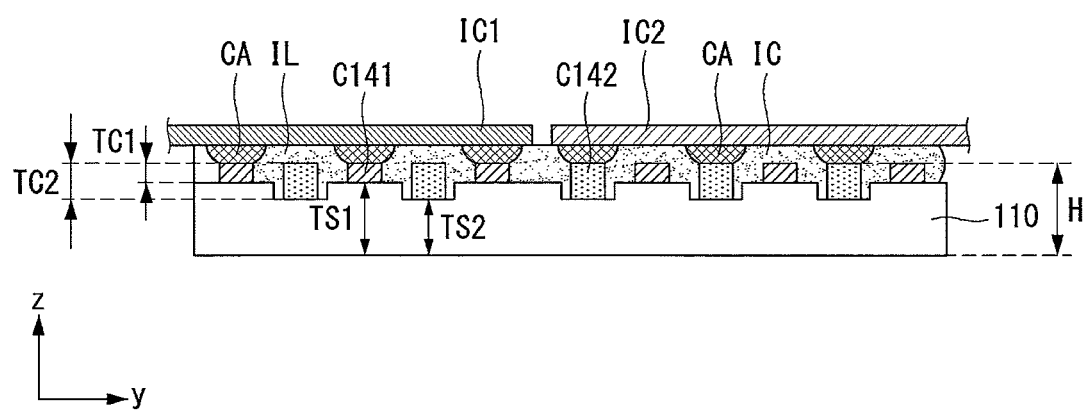
FIG. 11 shows an example where a thickness of a semiconductor substrate of each solar cell in a solar cell module according to an example embodiment of the invention is not uniform.

FIG. 11 shows an example where a thickness of a semiconductor substrate of each solar cell in the solar cell module according to the embodiment of the invention is not uniform.

As shown in FIG. 11, in the solar cell applicable to the solar cell module according to the embodiment of the invention, a thickness of the semiconductor substrate 110 may not be uniform, and thicknesses of the first and second electrodes C141 and C142 may be different from each other.

A reason why the thickness of the semiconductor substrate 110 is not uniform is because the back surface of the semiconductor substrate 110 is partially etched along a longitudinal direction of the emitter region 121 or the back surface field region 172 during a process for forming the emitter region 121 and the back surface field region 172 at the back surface of the semiconductor substrate 110 in FIGS. 7 and 8.

In other words, in the solar cell module according to the embodiment of the invention, a cross-sectional thickness of the semiconductor substrate 110 may not be uniform. For example, as shown in FIG. 11, a thickness TS1 of a first portion of the semiconductor substrate 110, on which the plurality of first electrodes C141 are positioned, may be greater than a thickness TS2 of a second portion of the semiconductor substrate 110, on which the plurality of second electrodes C142 are positioned.

In this instance, because the thickness of the semiconductor substrate 110 is not uniform, it may not be easy to electrically connect the interconnector IC to the electrodes C141 or C142 if thicknesses of the first and second electrodes C141 and C142 positioned on the back surface of the semiconductor substrate 110 are the same as each other. Further, even if the electrical connection between the interconnector IC and the electrodes C141 or C142 is performed, the electrical connection may be subsequently bad.

Hence, as shown in FIG. 11, in the solar cell module according to the embodiment of the invention, a thickness TC1 of each first electrode C141 may be less than a thickness TC2 of each second electrode C142, so as to prevent the bad connection.

In this instance, a sum H of the thickness TS1 of the first portion of the semiconductor substrate 110 and the thickness TC1 of the first electrode C141 may be the same as a sum H of the thickness TS2 of the second portion of the semiconductor substrate 110 and the thickness TC2 of the second electrode C142 within a margin of error. The margin of error may be about 10%.

As shown in FIG. 11, the solar cell module according to the embodiment of the invention compensates a difference between the thicknesses of the semiconductor substrate 110 for a difference between the thicknesses of the first and second electrodes C141 and C142. Therefore, it may be easy to electrically connect the interconnector IC to the electrodes C141 or C142, and the bad connection may be prevented in advance.

So far, the embodiment of the invention described that the interconnector IC includes only the core IC-C and the coating layer IC-S, as an example. However, the embodiment of the invention may further include an auxiliary metal layer on the surface of the coating layer IC-S of the interconnector IC, so as to further reduce a resistance of the interconnector IC and further increase the adhesive strength of the interconnector IC. This will be described in detail below.

Figure 12:
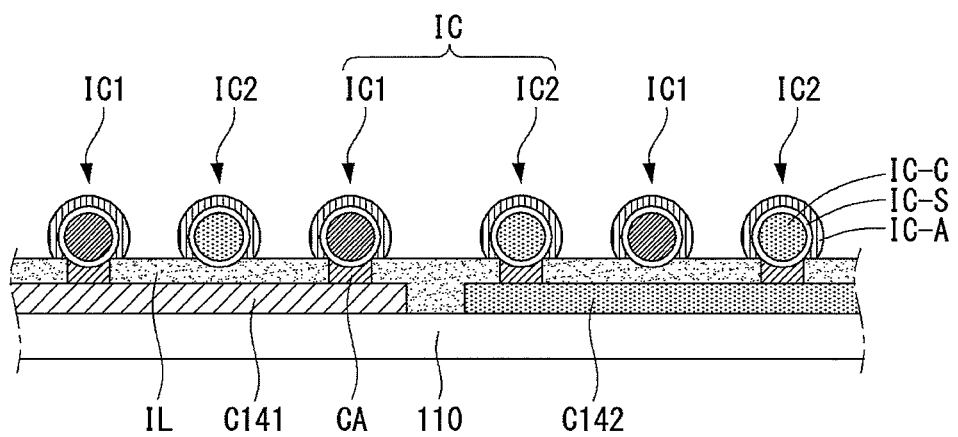
FIG. 12 shows an example where an interconnector in a solar cell module according to an example embodiment of the invention further includes an auxiliary metal layer.

FIG. 12 shows an example where the interconnector IC in the solar cell module according to the embodiment of the invention further includes an auxiliary metal layer.

The interconnector IC according to the embodiment of the invention may further include an auxiliary metal layer IC-A on the surface of the coating layer IC-S, in addition to the core IC-C and the coating layer IC-S.

FIG. 12 is a cross-sectional view taken along line CS2-CS2 of FIG. 1 when the interconnector IC in the solar cell module according to the embodiment of the invention further includes the auxiliary metal layer IC-A.

As shown in FIG. 12, the auxiliary metal layer IC-A may have a uniform thickness along a cross section of the core IC-C. However, the thickness of the auxiliary metal layer IC-A may be not uniform.

More specifically, as shown in FIG. 12, the auxiliary metal layer IC-A may be positioned on the surface of the interconnector IC as well as the surface of the coating layer IC-S and may cover a portion of the insulating layer IL.

FIG. 12 shows that a width of an application portion of the conductive adhesive CA is less than a width of the interconnector IC, as an example. On the contrary, when the width of the application portion of the conductive adhesive CA is greater than the width of the interconnector IC, the auxiliary metal layer IC-A may cover a portion of the conductive adhesive CA.

As described above, when the interconnector IC further includes the auxiliary metal layer IC-A on the surface of the coating layer IC-S, a cross-sectional area of the interconnector IC may further increase, and thus a resistance of the interconnector IC may further decrease. Hence, a short circuit current and a fill factor of the solar cell module according to the embodiment of the invention may be further improved.

Further, the auxiliary metal layer IC-A may be formed by applying a metal paste using a dispenser or an inkjet equipment in a state where the interconnector IC is connected to each solar cell or is temporarily connected to each solar cell, and then performing a thermal process or a plating method.

Hence, a connection strength between each solar cell and the interconnector IC may be further improved.

FIG. 12 shows that the auxiliary metal layer IC-A is formed on the surface of the interconnector IC when the interconnector IC includes the core IC-C and the coating layer IC-S, as an example. However, when the interconnector IC includes only the core IC-C, the auxiliary metal layer IC-A may be equally formed on the surface of the interconnector IC including the core IC-C. Namely, the auxiliary metal layer IC-A may be positioned on the surface of the core IC-C.

So far, the structure of the solar cell module according to the embodiment of the invention was mainly described. Hereinafter, various examples of a method for manufacturing the solar cell module according to the embodiment of the invention are described.

FIGS. 13 to 17 show various examples of a method for manufacturing the solar cell module according to the embodiment of the invention.

Figure 13:
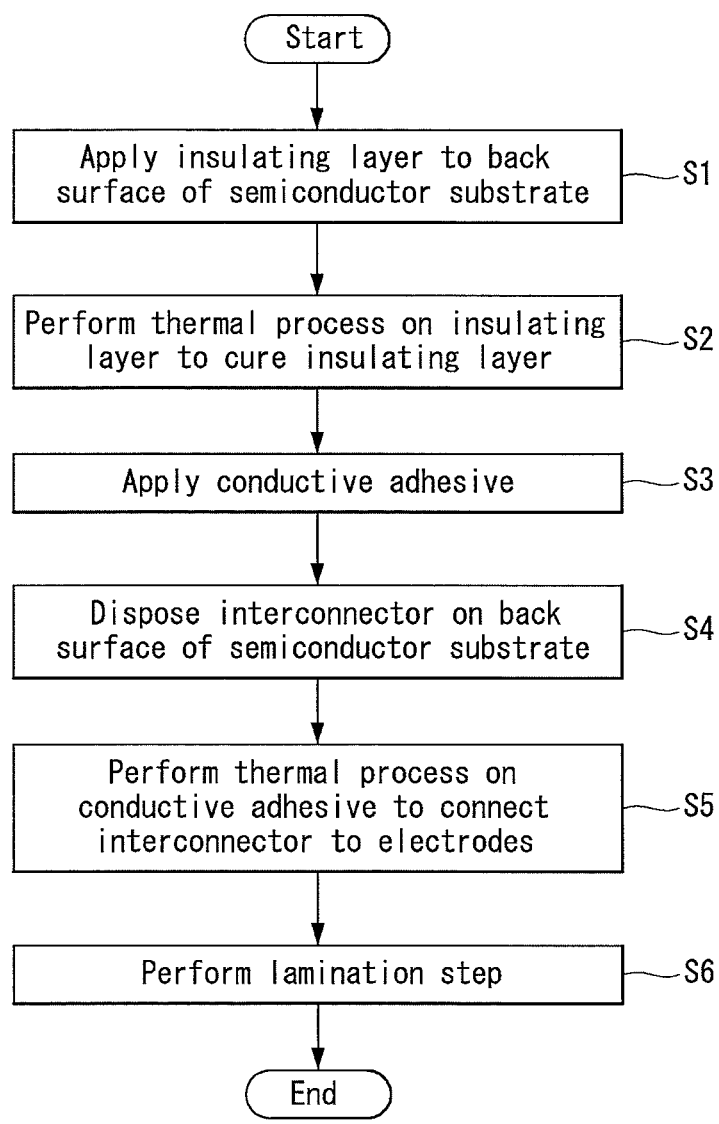
Figure 15:
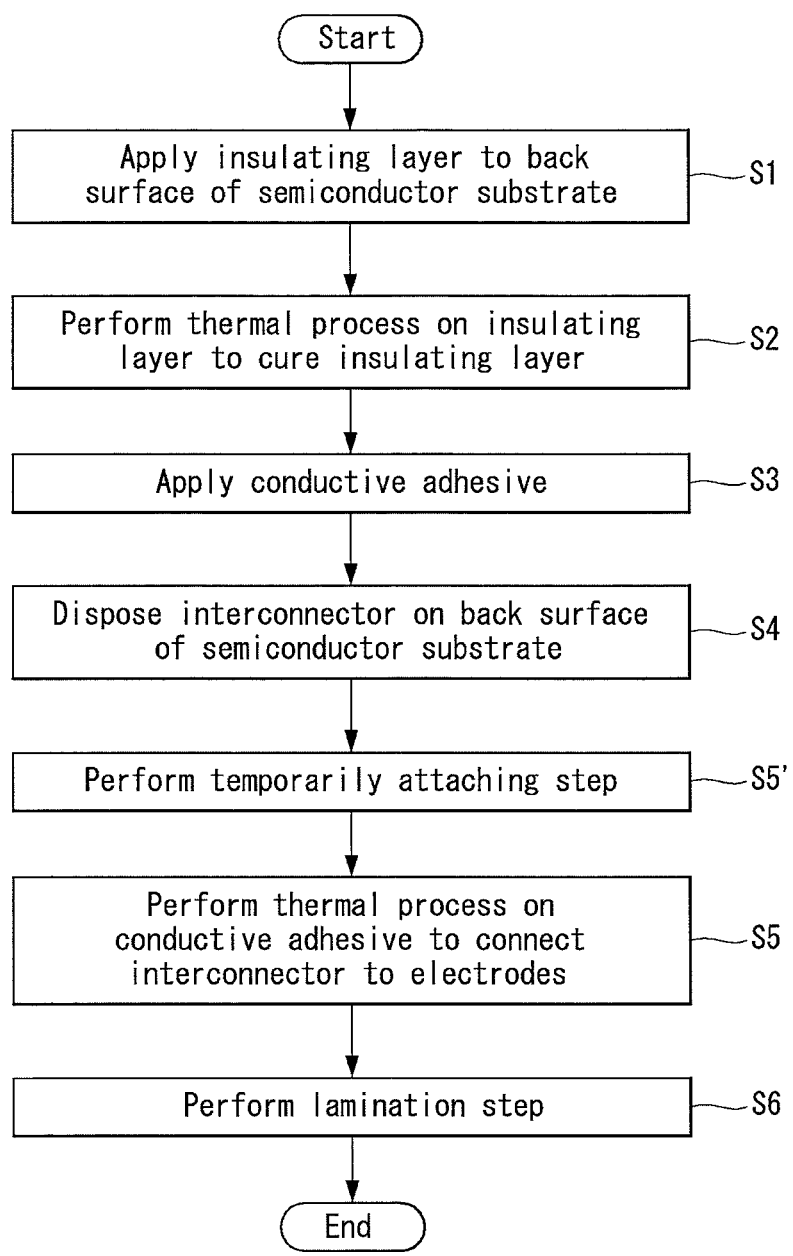

The description of structures and components identical or equivalent to those of FIG. 13 may be briefly made or may be entirely omitted in FIGS. 15 to 17.

As shown in FIG. 13, a method for manufacturing the solar cell module according to the embodiment of the invention may include an insulating layer application step S1, an insulating layer curing step S2, a conductive adhesive application step S3, an interconnector disposition step S4, a tabbing step S5, and a lamination step S6.

In the insulating layer application step S1, the plurality of solar cells each including the semiconductor substrate 110, at which the p-n junction is formed, and the plurality of first and second electrodes C141 and C142, which are formed on the back surface of the semiconductor substrate 110 and are separated from each other, are provided as shown in FIGS. 7 and 8. Then, the insulating layer IL may be applied to a portion, which is not electrically connected to the interconnector IC in the back surface of the semiconductor substrate 110 of each solar cell, and thus the first opening OP1 and the second opening OP2 having the pattern shown in FIG. 9 or FIG. 10 may be formed.

After the insulating layer IL is applied, the insulating layer curing step S2 for performing a thermal process on the insulating layer IL to cure the insulating layer IL may be performed.

In the insulating layer curing step S2, a curing temperature of the thermal process may be about 210° C. to 250° C., and a melting temperature of the insulating layer IL may be equal to or higher than about 400° C.

Hence, the insulating layer IL shown in FIG. 9 or FIG. 10 may be formed on the back surface of the semiconductor substrate 110.

After the insulating layer IL is cured, the conductive adhesive CA may be applied to one of the first and second electrodes C141 and C142, on which the insulating layer IL is not formed, so as to connect the plurality of solar cells in series. Namely, the conductive adhesive CA may be applied to the first opening OP1 and the second opening OP2 of the insulating layer IL shown in FIG. 9 or FIG. 10.

As shown in (a) or (b) of FIG. 4, the conductive adhesive CA may include the same material or the same metal-based material as a metal material included in the interconnector IC, so as to improve the adhesive strength and the contact resistance between the conductive adhesive CA and the interconnector IC. Namely, the interconnector IC and the conductive adhesive CA may include the first metal material or a metal alloy material including the first metal material.

In the embodiment disclosed herein, the temperature of the thermal process for curing the conductive adhesive CA is not particularly limited as long as it is lower than the melting temperature of the insulating layer IL of about 400° C. However, the temperature may be about 140° C. to 300° C. for the easier manufacturing process of the solar cell module.

The tabbing step S5 for performing the thermal process on the conductive adhesive CA to connect the interconnector IC to the electrodes C141 or C142 and the lamination step S6 may be simultaneously performed for the simplification of the manufacturing process of the solar cell module. The conductive adhesive CA having a curing temperature of about 145° C. to 165° C. may be used in the tabbing step S5.

A reason why the conductive adhesive application step S3 is performed after the insulating layer curing step S2, is to prevent in advance the undesired short circuit or the undesired shunt, which may be generated when the material of the insulating layer IL and the material of the conductive adhesive CA are mixed with each other during the thermal process.

Namely, when where the insulating layer IL and the conductive adhesive CA are cured at a time in a state where the insulating layer IL and the conductive adhesive CA are applied, the partial material of the conductive adhesive CA may be mixed with the material of the insulating layer IL. Hence, the undesired short circuit or the undesired shunt may be generated.

However, as in the embodiment of the invention, when the conductive adhesive CA is applied after the insulating layer IL is cured, the short circuit may be prevented in advance.

After the conductive adhesive CA is applied, the interconnector disposition step S4 for disposing the plurality of interconnectors IC on the back surface of the semiconductor substrate 110, to which the conductive adhesive CA is applied, may be performed.

In the interconnector disposition step S4, as shown in FIG. 1, the plurality of solar cells may be arranged in the second direction y so that the plurality of first and second electrodes C141 and C142 included in each solar cell are arranged in the first direction x. Further, the interconnectors IC may be arranged in the second direction y crossing the electrodes C141 or C142 included in each solar cell.

Each interconnector IC may overlap one C141 or C142 of the first and second electrodes C141 and C142 of each solar cell, to which the conductive adhesive CA is applied.

After the interconnector disposition step S4, the tabbing step S5 for performing the thermal process on the conductive adhesive CA to connect the plurality of solar cells in series through the plurality of interconnectors IC may be performed.

In the tabbing step S5, the conductive adhesive CA may be solidly cured and thus may solidly attach the plurality of interconnectors IC to the electrodes C141 or C142 of each solar cell.

Hence, the plurality of solar cells may be connected in series to one another through the plurality of interconnectors IC to form a string.

In the embodiment disclosed herein, the temperature of the thermal process of the conductive adhesive CA in the tabbing step S5 may be about 140° C. to 300° C. However, the embodiment of the invention is not limited thereto. For example, the temperature of the thermal process of the conductive adhesive CA in the tabbing step S5 may be about 145° C. to 165° C.

When the temperature of the thermal process in the tabbing step S5 is about 145° C. to 165° C., the bending of the semiconductor substrate 110 of each solar cell in the tabbing step S5 may be greatly reduced because the temperature of the thermal process is relatively low. Further, because the tabbing step S5 is not separately performed and may be performed at the same time as the lamination step S6, the manufacturing process of the solar cell module may be further simplified.

Hence, the solar cell module according to the embodiment of the invention may be completed.

Figure 14:
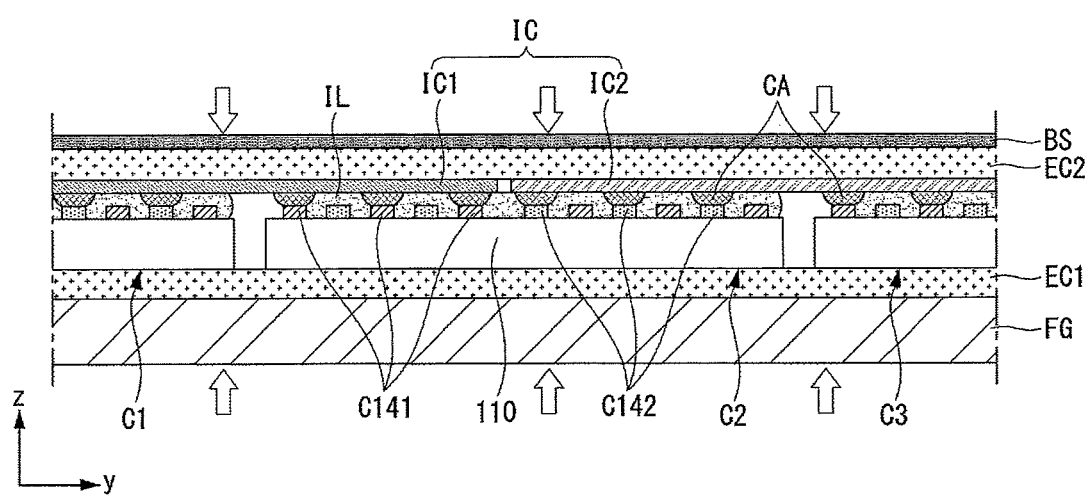

Alternatively, after the tabbing step S5, the lamination step S6 may be performed. As shown in FIG. 14, in the lamination step S6, a thermal pressurization process, in a state where the plurality of solar cells are positioned on a first encapsulant EC1 applied to a transparent substrate FG and then a second encapsulant EC2 and a back sheet BS are disposed on the plurality of solar cells, may be performed in a direction indicated by the arrow shown in FIG. 14.

The transparent substrate FG may be formed of glass material with light transmission or plastic material with light transmission. The first and second encapsulants EC1 and EC2 may be formed of a material with elasticity and insulation, for example, ethylene vinyl acetate (EVA). Further, the back sheet BS may be formed of an insulating material having a moisture-proof function.

A temperature of the thermal pressurization process in the lamination step S6 may be about 145° C. to 165° C.

FIG. 13 shows that the tabbing step S5 and the lamination step S6 are individually performed, as an example. On the contrary, the tabbing step S5 and the lamination step S6 may be simultaneously performed for the simplification of the manufacturing process of the solar cell module. In this instance, the temperature of the thermal process in the tabbing step S5 and the lamination step S6 may be about 145° C. to 165° C.

Further, FIG. 13 shows that one tabbing step S5 is performed through the thermal process for curing the conductive adhesive CA and connecting the interconnector IC to the electrodes C141 or C142, as an example. Other methods may be used.

More specifically, as shown in FIG. 15, a temporarily attaching step S5' for temporarily attaching the plurality of interconnectors IC to the electrodes C141 or C142 may be further performed by performing a thermal process at a temperature lower than the temperature of the thermal process of the tabbing step S5.

Hence, the plurality of interconnectors IC and the electrodes C141 or C142 may be connected to each other through the temporarily attaching step S5' and the tabbing step S5. In this instance, the temporarily attaching step S5' may be performed between the interconnector disposition step S4 and the tabbing step S5. The temperature of the thermal process in the temporarily attaching step S5' may be about 90° C. to 120° C.

Thus, the temporarily attaching step S5' may be performed in a state where the interconnectors IC are disposed on the back surfaces of the solar cells, and then the tabbing step S5 may be performed in a state where the interconnectors IC are fixed to each solar cell. As a result, the adhesive strength and the contact resistance between the interconnectors IC and the solar cell may be more strongly secured.

In this instance, unlike FIG. 15 that shows an example where the tabbing step S5 and the lamination step S6 are individually performed, the tabbing step S5 and the lamination step S6 may be simultaneously performed.

In particular, when the tabbing step S5 and the lamination step S6 are simultaneously performed in a state where the interconnectors IC are temporarily attached to the electrodes C141 or C142, the interconnectors IC are not out of alignment. Hence, it may be more advantageous to the simplification of the manufacturing process of the solar cell module.

Further, unlike FIG. 15, instead of the temporarily attaching step S5', the thermal process is not performed, and a separate fixing tape may be attached to upper parts of the interconnectors IC and the back surface of the semiconductor substrate 110 in a state where the plurality of interconnectors IC are disposed on the back surface of the solar cell, thereby temporarily fixing the plurality of interconnectors IC to the back surface of the solar cell.

In addition to the method for manufacturing the solar cell module illustrated in FIG. 13, an auxiliary metal layer formation step S-ICA for forming the auxiliary metal layer IC-A on the surface of the interconnector IC may be further performed after the interconnector disposition step S4.

Namely, for example, as shown in FIG. 16, the auxiliary metal layer formation step S-ICA may be performed between the tabbing step S5 and the lamination step S6.

The auxiliary metal layer formation step S-ICA may be performed by applying a metal paste using a dispenser or an inkjet equipment in a state where the interconnector IC is connected to each solar cell and then performing the thermal process or the plating method. Hence, the auxiliary metal layer IC-A shown in FIG. 12 may be additionally formed on the surface of the interconnector IC.

Further, when the method for manufacturing the solar cell module further includes the temporarily attaching step S5' as shown in FIG. 15, the auxiliary metal layer formation step S-ICA may be performed between the temporarily attaching step S5' and the tabbing step S5 as shown in FIG. 17.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
    a plurality of solar cells each including a semiconductor substrate, a plurality of emitter regions and a plurality of back surface field regions positioned at a back surface of the semiconductor substrate, a plurality of first electrodes extended in a first direction and connected on the plurality of emitter regions, and a plurality of second electrodes extended in the first direction and connected on the plurality of back surface field regions;

a plurality of first interconnectors extended in a second direction crossing the first direction and configured to be connected to the plurality of first electrodes of a solar cell of the plurality of solar cells through a plurality of first conductive adhesives, and configured to be isolated to the plurality of second electrodes of the solar cell of the plurality of solar cells;

a plurality of second interconnectors extended in the second direction and configured to be connected to the plurality of second electrodes of the solar cell of the plurality of solar cells through a plurality of second conductive adhesives, and configured to be isolated to the plurality of first electrodes of the solar cell of the plurality of solar cells; and a plurality of insulating layers locally formed at a plurality of intersection regions of the pluralities of first and second electrodes of the solar cell of the plurality of solar cells and the pluralities of first and second interconnectors, the plurality of insulating layers being spaced apart from one another in each of the first and second directions, wherein each interconnector includes a core formed of a conductive metal material and a solder coating layer coated on a surface of the core, and wherein each insulating layer of the plurality of insulating layers at the plurality of intersection regions of the plurality of first electrodes of the solar cell of the plurality of solar cells and the plurality of first interconnectors, and at the plurality of intersection regions of the plurality of second electrodes of the solar cell of the plurality of solar cells and the plurality of second interconnectors has a barrier shape with an opening.

2. The solar cell module of claim 1, wherein the plurality of first conductive adhesives and the plurality of second conductive adhesives are positioned in the opening of the each insulating layer having the barrier shape with the opening of the plurality of insulating layers.

3. The solar cell module of claim 1, further comprising another solar cell in which an insulating layer has a plurality of openings for partially exposing the plurality of first electrodes or the plurality of second electrodes connected to the plurality of second interconnectors.

4. The solar cell module of claim 1, wherein in the semiconductor substrate of each solar cell, a thickness of a first portion of the semiconductor substrate, on which the plurality of first electrodes are positioned, is greater than a thickness of a second portion of the semiconductor substrate, on which the plurality of second electrodes are positioned, and wherein a thickness of each first electrode is less than a thickness of each second electrode.

5. The solar cell module of claim 4, wherein a sum of the thickness of the first portion of the semiconductor substrate and the thickness of the each first electrode is the same as a sum of the thickness of the second portion of the semiconductor substrate and the thickness of the each second electrode within a margin of error.

6. The solar cell module of claim 5, wherein the margin of error is 10%.

7. The solar cell module of claim 1, wherein a cross section of the each interconnector of the pluralities of first and second interconnectors has a wire shape, in which a width and a thickness are the same as each other, a rectangular shape in which a width is greater than a thickness, a trapezoidal shape, or a polygonal shape.

8. The solar cell module of claim 1, wherein the solder coating layer of the each interconnector of the pluralities of first and second interconnectors, the pluralities of first and second electrodes, and the plurality of first conductive adhesives and the plurality of second conductive adhesives made of a solder paste commonly include a first metal material including at least one of tin (Sn), gold (Au), silver (Ag), copper (Cu), or nickel (Ni) or a metal alloy material including the first metal material, and wherein the first metal material or the metal alloy material included in the plurality of first conductive adhesives and the plurality of second conductive adhesives contact the first metal material or the metal alloy material included in the solder coating layer of the each interconnector of the pluralities of first and second interconnectors.

9. The solar cell module of claim 1, wherein each insulating layer of the plurality of insulating layers at the plurality of intersection regions of the plurality of second electrodes of the solar cell of the plurality of solar cells and the plurality of first interconnectors, and at the plurality of intersection regions of the plurality of first electrodes of the solar cell of the plurality of solar cells and the plurality of second interconnectors lacks an opening.

10. The solar cell module of claim 1, wherein the each insulating layer having the barrier shape with the opening is annular.

11. The solar cell module of claim 1, wherein the plurality of first conductive adhesives and the plurality of second conductive adhesives are spaced apart from one another in the first direction.

* * * * *